United States Patent [19]
Holcomb

[11] Patent Number: 4,757,600
[45] Date of Patent: Jul. 19, 1988

[54] RADIAL LEAD ELECTRICAL COMPONENT FEEDER

[76] Inventor: Gregory W. Holcomb, 13 Viento, Irvine, Calif. 92714

[21] Appl. No.: 78,111

[22] Filed: Jul. 27, 1987

[51] Int. Cl.[4] .................. B23P 23/00; H01R 43/00
[52] U.S. Cl. .................... 29/566.3; 29/564.6; 29/564.8; 29/566.2; 29/741
[58] Field of Search .................. 29/564, 33 M, 564.6, 29/564.7, 564.8, 565, 566.1, 566.2, 566.3, 741, 563; 140/105

[56] References Cited

U.S. PATENT DOCUMENTS

| | | | |
|---|---|---|---|
| 3,798,734 | 3/1974 | Fedor | 29/566.3 |
| 4,206,539 | 6/1980 | Weresch | 29/33 M |
| 4,387,500 | 6/1983 | Weresch | 29/566.3 |
| 4,403,390 | 9/1983 | Woodman, Jr. | 29/741 |
| 4,403,723 | 9/1983 | Dean et al. | 29/564.6 |
| 4,567,653 | 2/1986 | Heller et al. | 29/741 |

FOREIGN PATENT DOCUMENTS 239503 9/1986 German Democratic Rep. ... 29/741

Primary Examiner—Gil Weidenfeld
Assistant Examiner—Daniel W. Howell
Attorney, Agent, or Firm—Roberts and Quiogue

[57] ABSTRACT

A component lead cutting and forming apparatus for radial lead electrical components secured to tape, including first and second stations for processing each of the electrical components. The first station includes clamping apparatus for strain relief clamping the component lead, and also for supporting and aligning the body of the component. Blades and bending dies located at the first station cut and form a selected lead. The second station includes clamping apparatus for strain relief clamping the remaining uncut leads, and also includes blades for cutting the remaining uncut leads.

18 Claims, 4 Drawing Sheets

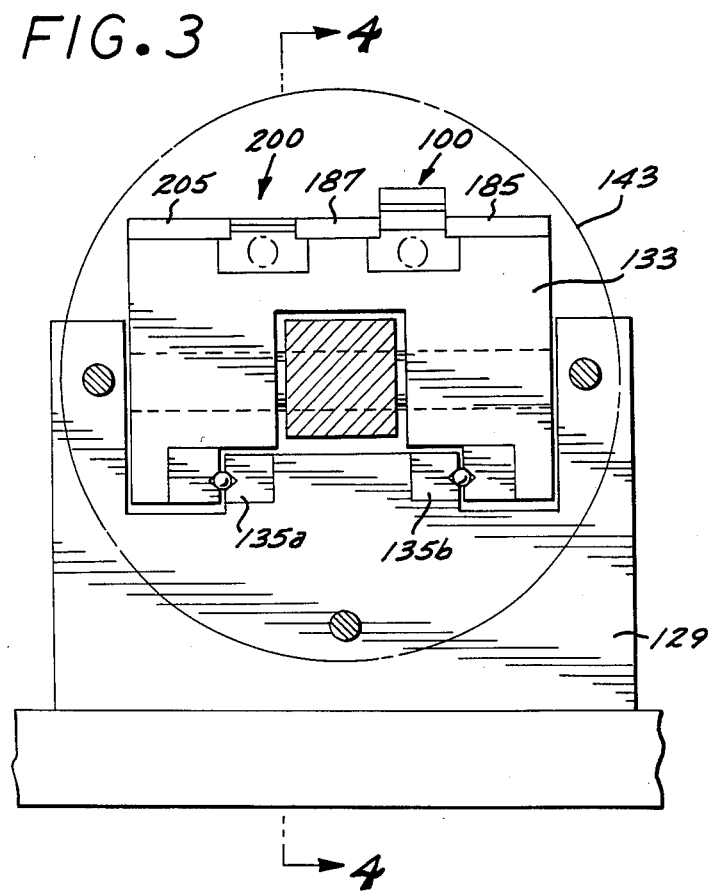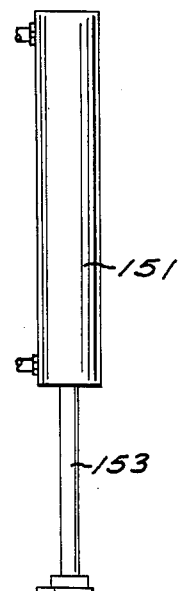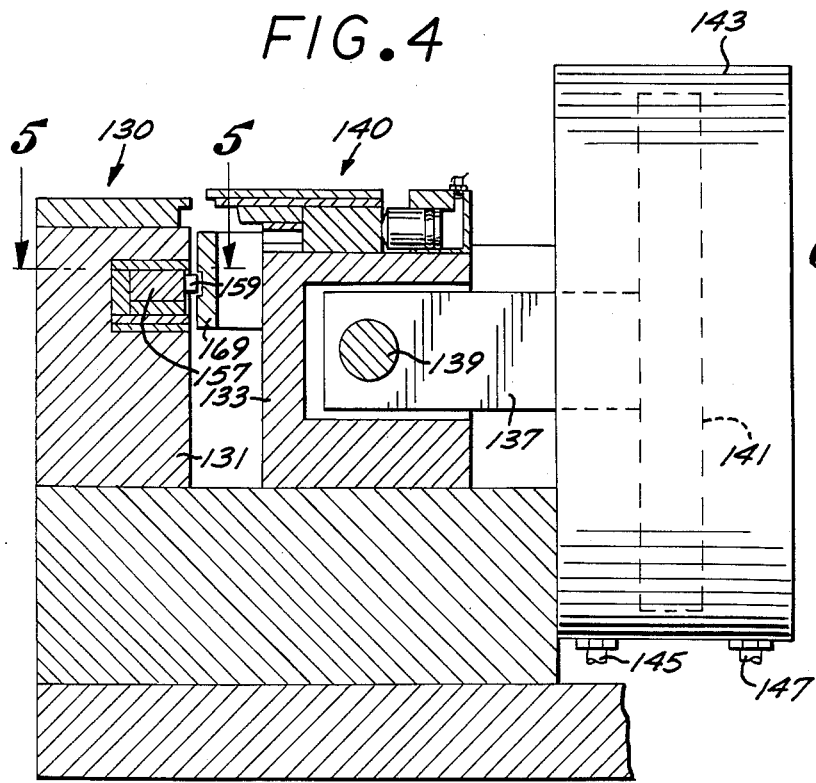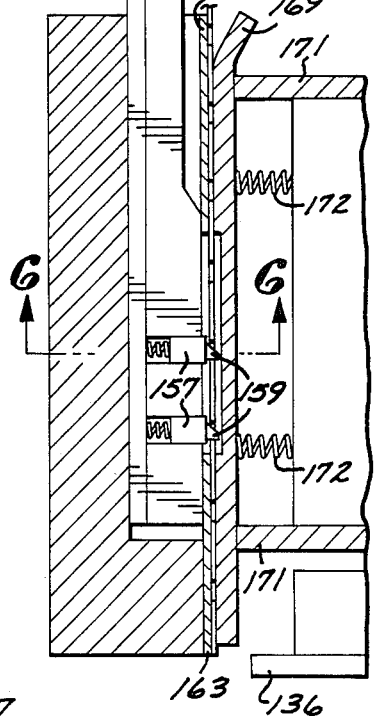

RADIAL LEAD ELECTRICAL COMPONENT FEEDER

BACKGROUND OF THE INVENTION

The disclosed invention generally relates to apparatus for forming the leads of taped electrical components, and is more particularly directed to apparatus for cutting and forming the leads of taped components having radial leads.

For utilization in the fabrication of electrical circuits, electronic components such as transistors, capacitors, and resistors are provided by component manufacturers with their leads secured to an elongated tape which includes generally equally spaced feed holes. A particular type of component configuration, generally known as radial lead components, have leads which emerge from generally the same side or portion of the component.

For utilization, taped electronic components are separated from the tape by cutting the leads and appropriately forming the cut leads for insertion. The cutting and forming has generally been performed with different types of machinery. For example, dedicated machines cut and form leads, and also insert the components. However, such dedicated machinery generally are capable of processing only a specific component, require a large amount of space, and not readily utilized with robotic component insertion.

As another example of taped component lead cut and form machinery are machines which deposit or place the processed components in a container for manual retrieval and insertion. Such machinery are also not readily utilized with robotic component insertion, and may require a large amount of space.

A further example of taped component lead cut and form machinery are machines originally designed for manual component retrieval and insertion, and which are modified for use with robotic component insertion. Such machinery, however, tend to be compromises since they are being forced to operate in a manner not contemplated by their original designs.

Other taped component lead cut and form machines include those designed for use with robotic component insertion. However, such apparatus are believed to be unreliable and fail to provide the components in insertion ready form. Also, such known cut and form apparatus are not readily adaptable to different types of electronic components.

SUMMARY OF THE INVENTION

It would therefore be an advantage to provide a reliable cut and form apparatus for cutting and forming the leads of taped radial lead electronic components for use with robotic component insertion.

It would also be an advantage to provide such cut and form apparatus which is readily and easily adapted to different types of electronic components.

The foregoing and other advantages are provided by a component lead cutting and forming apparatus which includes feeding apparatus for sequentially positioning each of the taped radial lead electrical components at first and second stations for processing. The first station includes clamping apparatus for strain relief clamping the component lead, and also for supporting and aligning the body of the component. Blades and bending dies located at the first station cut and form a selected lead. The second station includes clamping apparatus for strain relief clamping the remaining uncut leads, and also includes blades for cutting the remaining uncut leads. After the leads are cut at the second station, the component is ready for robotic pick-up.

BRIEF DESCRIPTION OF THE DRAWING

The advantages and features of the disclosed invention will readily be appreciated by persons skilled in the art from the following detailed description when read in conjunction with the drawing wherein:

FIG. 3 is a sectional view of the taped component lead cut and form apparatus of the invention taken along the section lines 3 in FIG. 1.

FIG. 4 is a sectional view of the taped component lead cut and form apparatus of the invention taken along the section lines 4 in FIG. 3.

FIG. 5 is a sectional view of the taped component lead cut and form apparatus of the invention taken along the section lines 5 in FIG. 4.

DETAILED DESCRIPTION

Figure 1:
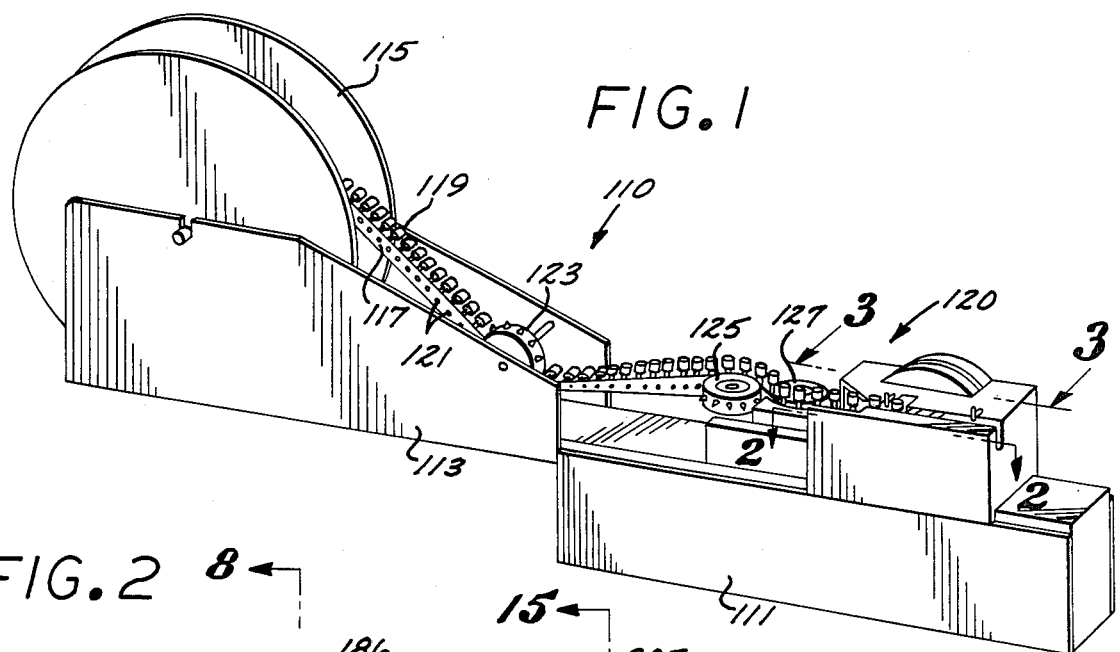
FIG. 1 is a perspective view of a taped component processing machine which utilizes the taped component lead cut and form apparatus of the invention.

In the following detailed description and in the several figures of the drawing, like elements are identified with like reference numerals.

Referring now to FIG. 1, shown therein is a taped component processing machine 110 which includes the taped component lead cut and form apparatus 120 of the invention. The processing machine 110 includes a base 111 on which the cut and form apparatus 120 is mounted. As shown, the base 111 may be generally a rectangular box, which allows for the collection of the scrap tape pieces which remain after the cut and form procedures. Secured to one end of the base 111 is a tape reel support 113 for supporting an electrical component tape reel 115 of well known configuration.

The tape reel 115 stores a tape 117 which secures a plurality of electrical components 119, each having a plurality of leads emerging from generally the same side of the component. As is well known, such lead configuration is known as a radial lead configuration. Particularly, the leads of the electrical components 119 are secured to the tape 117, which includes a plurality of equally spaced apertures 121 which are useful in feeding the tape.

A guide sprocket 123 is rotatably mounted in the tape reel support 113 for guiding the tape 117 as it is being fed from the tape reel 115. Guide sprockets 125, 127 are mounted on the base 111, also for guiding the tape 117. The axes of the guide sprockets 125, 127 are parallel to each other and are orthogonal to the axis of the guide sprocket 123.

Figure 2:
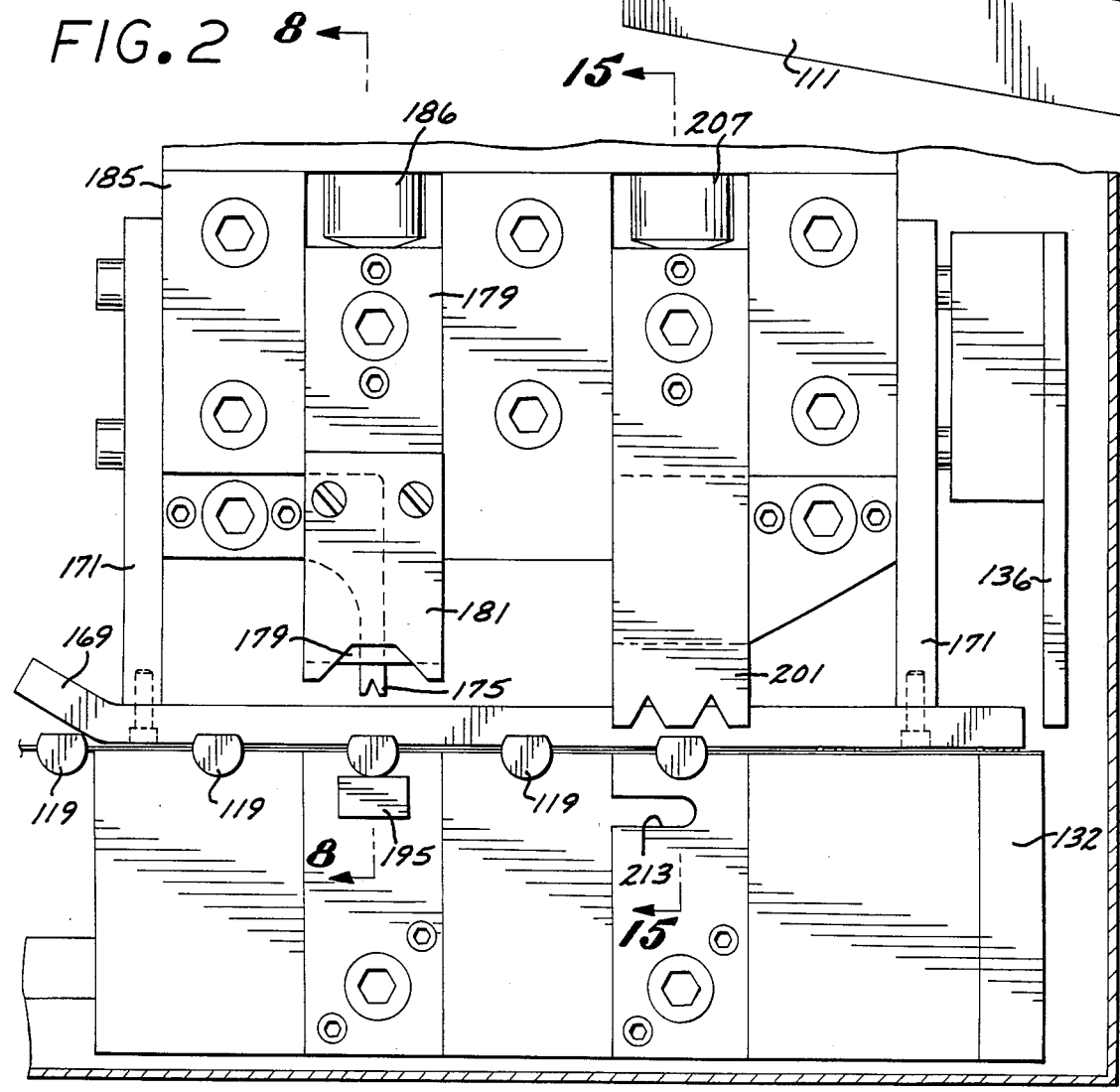
FIG. 2 is a partial top plan view of the lead cut and form apparatus shown in FIG. 1.

Referring also to FIGS. 2, 3 and 4, the component lead cut and form apparatus 120 includes a main support block 129, a stationary cut and form assembly 130, and a moving cut and form assembly 140. Generally, the moving cut and form assembly 140 is displaced toward the stationary cut and form assembly 130 so that elements of the moving cut and form assembly 140 engage associated elements of the stationary cut and form assembly 130 to provide the desired cutting and forming.

The stationary cut and form assembly 130 includes a support block 131 and cut and form elements to be described later. Also supported within the support block 131 is a ratchet and pawl mechanism, shown in greater detail in FIG. 5 to be discussed further herein, for feeding the tape 117. The support block 131 includes a cutting edge 132 which cooperates with a blade on the moving cut and form assembly 140 to cut tape scrap after components have been removed.

The moving cut and form assembly 140 includes a movable carriage block 133 which is slidably secured to the main support block 129 via a pair of slide assemblies 135a, 135b. The moving cut and form assembly 140 further includes moving cut and form elements to be discussed further herein. As shown in FIG. 5, a tape cutting blade 136 is attached to the moving carriage block 133 for cooperating with the cutting edge 132 on the stationary cut and form assembly 130 to cut the tape scrap that extends from the lead cut and form apparatus 120 upon each extension of the moving cut and form assembly 140.

The movable carriage block 133 of the moving cut and form assembly 140 is coupled to one end of a connecting rod 137 via a wrist pin 139. The other end of the connecting rod 137 is coupled to the piston 141 of an air cylinder 143 which is secured to the main support block 129. Air pressure is provided to the air cylinder 143 via air lines 145, 147 which are coupled to appropriately controlled air valves (not shown). Selective pressurization of the air cylinder 143 causes the moving cut and form assembly 140 to be displaced toward or away from the stationary cut and form assembly 130.

The disclosed component lead cut and form apparatus 120 includes other air cylinders in addition to the referenced air cylinder 143. For reference, the object coupled to the air cylinder (e.g., the moving cut and form assembly 140) is extended when the air cylinder causes the coupled object to be displaced away from the air cylinder. The coupled object is retracted toward the air cylinder.

Figure 6:
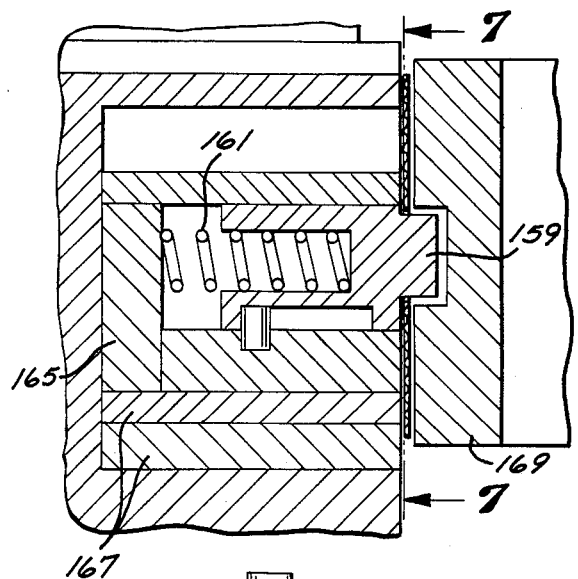
FIG. 6 is a detailed sectional view of a ratchet pawl of the ratchet tape feeding mechanism of the taped component lead cut and form apparatus of the invention.
Figure 7:
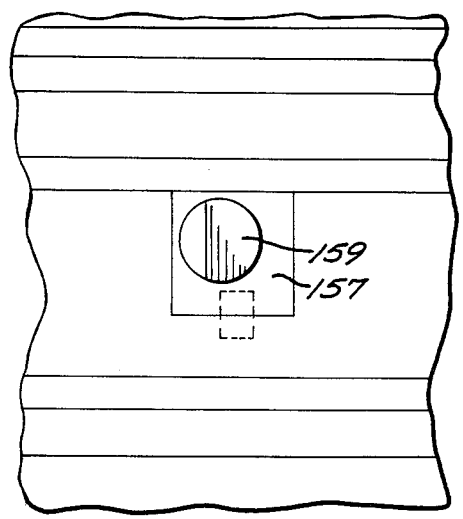
FIG. 7 is a detailed sectional view of the ratchet pawl of FIG. 6.

Referring now to FIGS. 5, 6 and 7, shown therein is a ratchet and pawl mechanism for selectively feeding the apertured tape 117 with the components 119 into the lead cut and form apparatus 120. A ratchet slide 149 is slidably mounted in a channel in the stationary cut and form assembly 130 and is connected to an air cylinder 151 via a connecting rod 153 and a pin 155. The ratchet slide is actuated for back and forth motion by the air cylinder 151.

The ratchet slide 149 includes a pair of ratchet pawls 157 having ramped pawl teeth 159 which are compressively biased by coil springs 161. The ramped surfaces of the pawl teeth face toward the air cylinder 151. The ratchet slide 149 is supported within the channel in the stationary cut and form assembly 130 by slide plates 163 which are separated and provide an opening through which the pawl teeth protrude. A wear plate 165 and shim inserts 167 are utilized to support the ratchet slide 149 in an appropriate position for the pawl teeth 159 to engage the apertures 121 in the component tape 117.

A brake shoe 169 is biased against the slide plate 163 and is supported by slotted arms 171 which are coupled to the movable carriage 133 and allow for adaptive movement of the brake shoe 169. The brake shoe 169 is biased by a pair of coil springs 172 which are mounted in the movable carriage 133. A recess formed in the brake shoe 169 allows the pawl teeth 159 to protrude through the apertures 121 in the component tape 117.

The ratchet mechanism is actuated to cooperate with the cutting and forming functions to locate the taped components at the proper locations. More particularly, the displacement of the ratchet slide 149 is controlled so that the components whose leads are to be cut and formed are in the proper position when the ratchet slide 149 is in its most extended position away from the air cylinder 151 with the pawl teeth 159 engaged in corresponding apertures. In its most retracted position toward the air cylinder 151, the pawl teeth 159 engage the next pair of apertures.

By way of example, the tape 117 is first manually placed between the slide plate 163 and the brake shoe 169 with the ratchet slide 149 in its most retracted position and the pawl teeth 159 engaged in two adjacent tape apertures. The ratchet slide 149 is then actuated to move away from the air cylinder 151, which causes the pawl teeth 159 to engaged the sides of the apertures 121 and thereby move the tape 117. The cut and form operations are performed, and the ratchet slide 149 is then actuated to move toward the air cylinder 151. As a result of displacement of the ratchet slide, the pawl teeth 159 retract as their ramped surfaces are biased against the sides of the apertures in which they were engaged. The pawl teeth 159 will engage the next pair of apertures when the ratchet slide reaches its most retracted position.

The disclosed component lead cut and form apparatus 120 contemplates a plurality of stations where each of the electronic components 119 stops for processing. Specifically, first and second processing stations are generally identified with the reference numerals 100, 200 in FIG. 3. The first and second stations 100, 200 are appropriately separated to allow location of an electronic component 119 at each station. As shown in FIG. 2, the stations 100, 200 are located so that one electronic component 119 is between the components 119 at the stations. It should be evident that the tape 117 is fed so that each component stops and is processed at each of the stations 100, 200.

Figure 8:
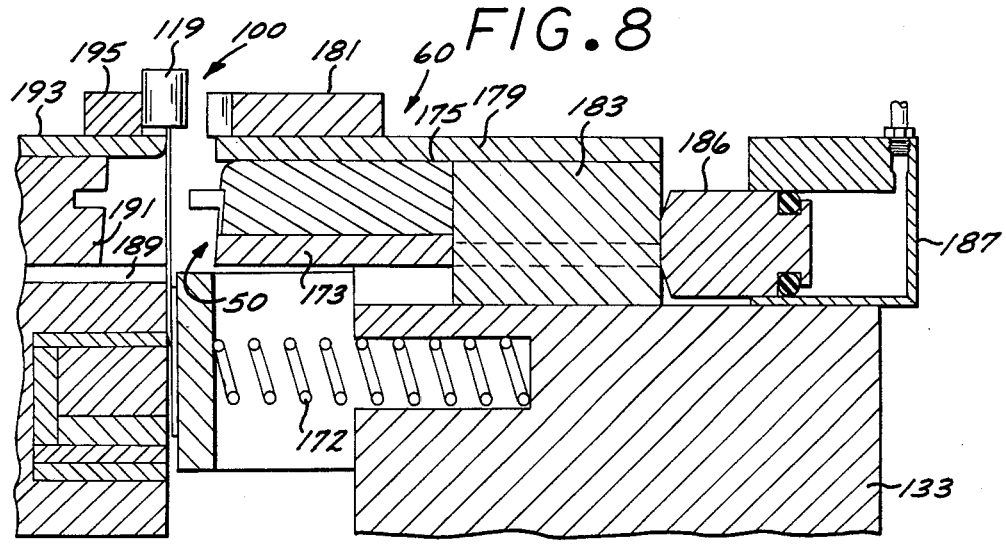
FIG. 8 is a sectional view of a first cut and form station in the taped component lead cut and form apparatus of the invention.
Figure 14:
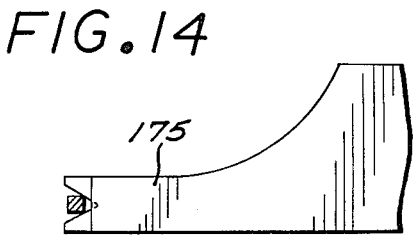
FIG. 14 is a detailed view of a lead comb of the first station of FIG. 8.

Referring now to FIG. 8, shown therein are moving and stationary cut and from elements of the first station 100 formed by the moving and stationary cut and form assemblies 130, 140. The moving cut and form elements include a lead cutting blade 173, and a lead comb and bending die element 175 in stacked fashion forming a blade/comb-die assembly 50. The curved upper portion of the comb-die element 175 comprises the bending die, while the lower notched portion of the comb-die element 175 comprises the lead comb. The blade/comb-die assembly 50 is fixedly secured to the movable carriage block 133. As shown, these elements are adapted to operate on the center lead of a three lead electronic component, such as a transistor, and as shown in FIG. 14, the comb-die element 175 includes a V-shaped notch for accepting and centering the center component lead.

The moving cut and form elements further include a strain relief lead clamp 179, a body support 181, and a slide block 183 which are secured together and are slidably secured in the movable carriage 133 as a moving clamp assembly 60. As shown in FIG. 2, the body support 181 includes a body alignment cutout which is shaped for a particular component body shape. The slide block 183 is T-shaped and is maintained in a channel in the moving support block by plates 185, 187 (FIG. 3). The slide block 183 is behind the blade/comb-die assembly 50, while the lead clamp 179 and the body support 181 are above them. The blade/comb-die assembly 50 serves as a forward stop for the moving clamp assembly 60.

The moving clamp assembly 60 is selectively biased forwardly toward and against the blade/comb-die assembly 50 by the piston 186 of an air cylinder 187. In the absence of actuating pressure in the air cylinder 187, the clamp assembly 60 is displaced away from the blade/comb-die assembly 50 by springs (not shown) causing the piston 186 to be pushed into the air cylinder 187.

The stationary cut and form elements at the first station include a stationary blade 189, a spacer 191, a bending die 193, and a body support block 195 which are secured in a stacked manner. The spacer 191 includes a recess for accepting the prongs of the comb-die element 175 of the blade/comb-die assembly 50.

Figure 15:
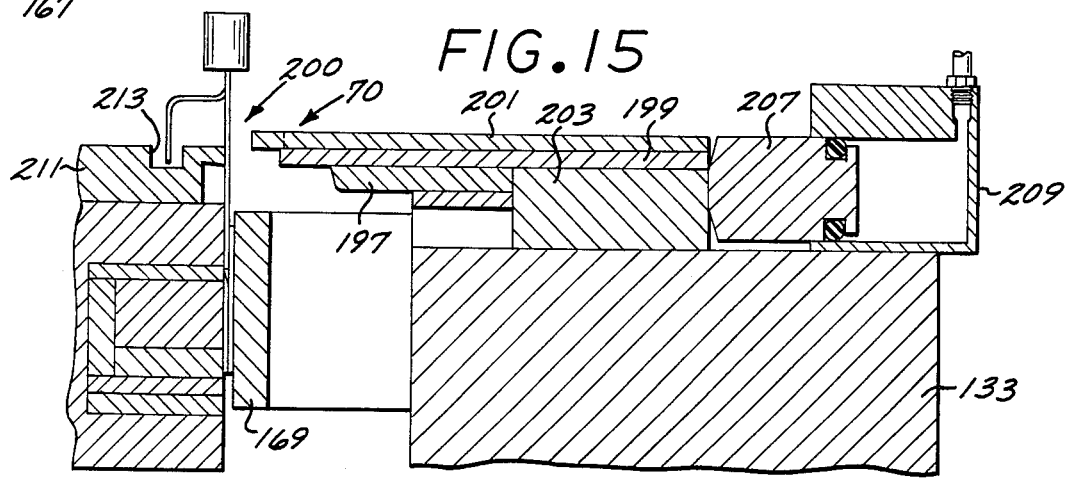
FIG. 15 is a sectional view of a second cut and form station of the taped component lead cut and form apparatus of the invention.
Figure 19:
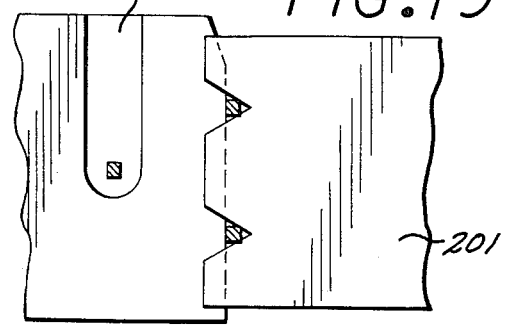
FIG. 19 is a detailed view of the lead comb of the station of FIG. 15.

Referring now to FIG. 15, shown therein are the cut and form elements of the second station 200 formed by cut and form elements on the moving and stationary cut and form assemblies 130, 140. The cut and form elements include a moving cutting blade 197 which is secured to the movable carriage block 133. A strain relief lead clamp 199, a lead comb 201, and a slide block 203 are secured together and are slidably secured in the moving support block as a moving comb/clamp assembly 70. The comb/clamp assembly 70 is configured for use with the outer leads of a three-lead component, and, as shown in FIG. 19, the comb 201 includes two V-shaped notches.

The slide block 203 is T-shaped and is maintained in a channel in the moving support block 133 by plates 187, 205 (FIG. 3). The slide block 203 is behind the cutting blade 197, while the lead clamp 199 and the lead comb 201 are above the blade. The cutting blade 197 serves as a forward stop for the moving comb/clamp assembly 70.

The moving comb/clamp assembly 70 is selectively biased forwardly toward and against the cutting blade 197 by the piston 207 of an air cylinder 209. In the absence of actuating pressure in the air cylinder 209, the comb/clamp assembly 70 is displaced away from the cutting blade 197 by springs (not shown), causing the piston 207 to be pushed into the air cylinder 209.

The stationary cut and form elements of the second station include a clamp/cutting member 211. The moving lead clamp 199 clamps the component leads against the stationary clamp/cutting member 211, while the moving cutting blade 197 engages the cutting edge of the clamp/cutting member 211. A channel 213 is formed in the top of the clamp/cutting member 211 to a accommodate the lead that was cut and formed at the previously discussed first station.

The sequence of operation of the foregoing elements is as follows. The component tape 117 is manually fed so as to engage the ratchet pawls 159 in apertures 121. The air cylinder 133 is actuated to retract the moving carriage block 143. When the air cylinder 143 is completely retracted, a cut/form sensor (not shown) is actuated, which causes actuation of the air cylinder 151 to extend the ratchet slide 149. When the air cylinder 151 is fully extended, an index extend sensor (not shown) is actuated, which causes pressurization of the air cylinders 187, 209. Such pressurization biases the moving clamp assembly 60 against the blade/comb-die assembly 50, and biases the moving comb/clamp assembly 70 against the cutting blade 197. The positioning of the elements pursuant to such pressurization of the air cylinders 187, 209 is illustrated in FIGS. 8 and 15.

After a short delay, the air cylinder 143 is actuated to extend the moving carriage block 133. Pursuant to such displacement, cut and form operations take place at the first and second stations concurrently. After another short delay, the cylinder 151 is actuated to retract the slide ratchet 149. After a further short delay, an appropriate component ready signal is transmitted to indicate that a component is ready for removal, and then the pressure in the air cylinders 187, 209 is dropped to allow for removal of the electronic component at the second station 200. The foregoing steps are then repeated, starting with retraction of the moving carriage block 133.

It should be noted that a part present sensor (not shown) is preferably incorporated in the second station 200. Such sensing could be utilized to determine whether a component ready signal is to be provided. Moreover, such sensor could be utilized to cycle the operations without providing a component ready signal, for example, as tape leader without components is feeding through, until a component is sensed at the second station.

The cut and form operations at the first station are illustrated in FIGS. 9 through 13, while the cut and form operations at the second station are illustrated in FIGS. 15 through 18. The respective operations of the first and second stations, which occur concurrently, will be described below separately as to each of the stations.

Figure 9:
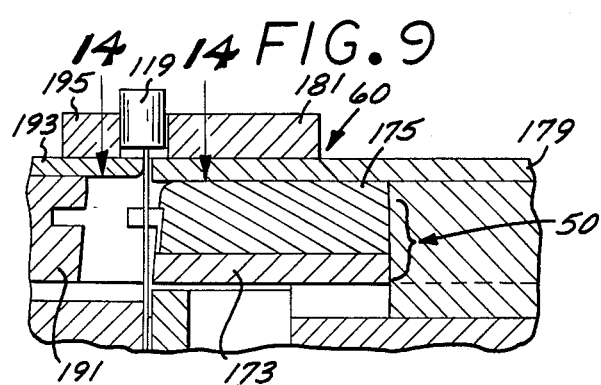
FIGS. 9 through 13 illustrate various positions of the cut and form elements of the first station of FIG. 8 in the process of cutting and forming a component lead.
Figure 10:
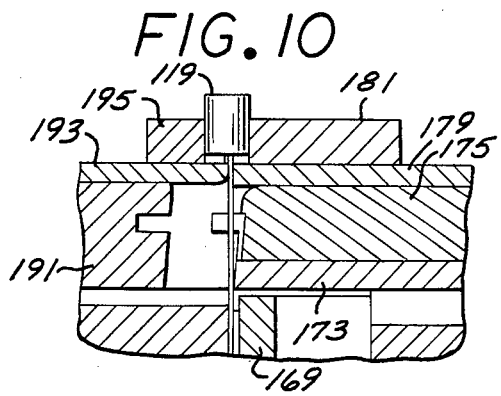
Figure 11:
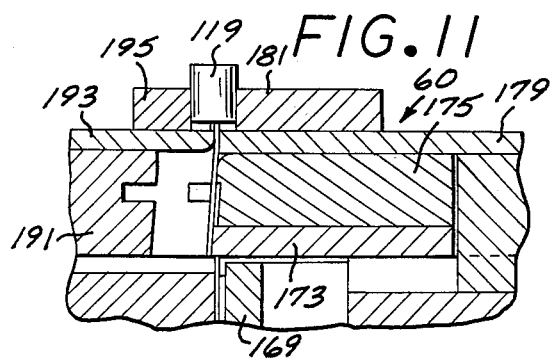
Figure 12:
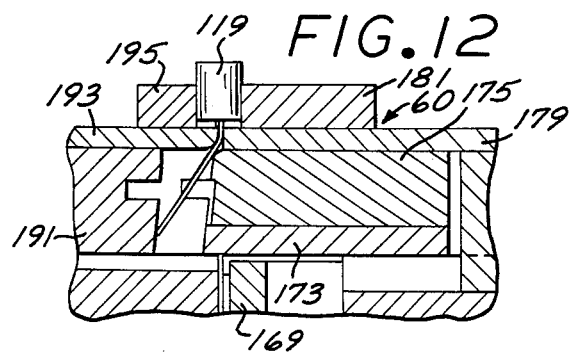
Figure 13:
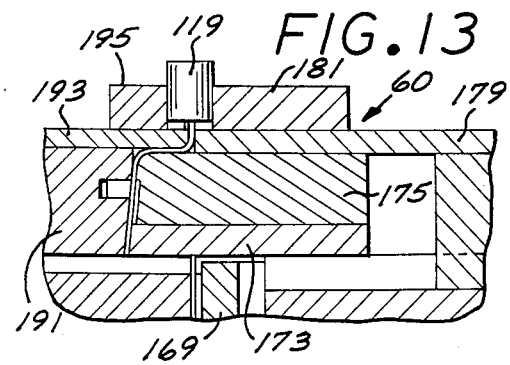

Referring now to FIGS. 9 through 13, the clamp assembly 60 and the blade/comb-die assembly 50 move together toward the stationary cut and form assembly 130 as shown in FIG. 9. The body support 181 engages and aligns the body of the electronic component 119 (for example, for a tilted component on the tape) against the stationary body support 195, while the moving clamp member clamps the component leads against the stationary bending die 193 to provide strain relief, which prevents stresses on the component when the center lead is cut. Such clamping is illustrated in FIG. 10. As the moving carriage block 133 continues to be displaced, the clamp assembly 60 remains stationary as illustrated in FIG. 11, and the piston 186 is pushed into the air cylinder 187 as the moving carriage block 133 continues to be displaced toward the stationary cut and form assembly 130. With such displacement, the comb of the comb-die element 175 positions the center lead, and the moving blade 173 engages the combed center component lead and cooperates with the stationary blade 189 to cut such lead as illustrated in FIG. 11.

Continued displacement of the moving carriage block 133 causes the bending die of the comb-die element 175 to bend the component lead against the stationary bending die 193 and also against the spacer 191. During such bending, illustrated in FIGS. 12 and 13, the lead is engaged in the notch of the comb-die element 175.

Figure 16:
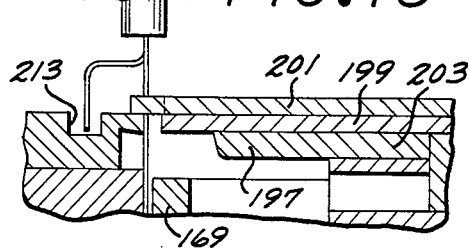
FIGS. 16 through 18 illustrate various positions of the cut and form elements of the station of FIG. 15 during its cut and form operation.
Figure 17:
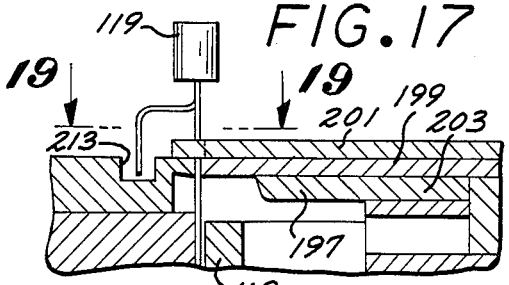
Figure 18:
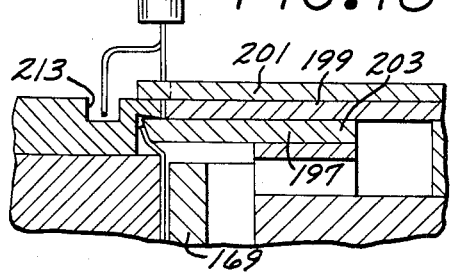

Referring now to FIGS. 16 through 18, the cutting blade 197 and the comb/clamp assembly 70 move together as a unit until the moving clamp member 199 engages the outside component leads against the stationary clamping member 211 to provide strain relief, which prevents stresses on the component when the outside leads are cut. Just prior to the clamping, the outside component leads are engaged by the notches in the comb 201 and combed into proper position.

The comb/clamp assembly 70 remains stationarily engaged against the clamp/cutting member 211 as the moving carriage block 133 continues to be displaced toward the stationary cut and form assembly 130. With such continued displacement, the blade 197 engages the outside component leads against the cutting edge of the stationary clamp/cutting member 211, thereby cutting the leads as illustrated in FIG. 18.

After the lead cutting operation shown in FIG. 18 is completed, the component at the second station is ready for removal, either manually or by automated equipment. After such removal, the previously discussed operations are repeated.

The foregoing has been a disclosure of a radial lead cut and form apparatus which advantageously provides for multiple stations and allows for simple adaptation to different radial lead configurations and forming requirements. Specifically, as schematically illustrated in the figures of the drawing, the clamp, die, comb, and cutting elements comprise planar structures having edges or attachments appropriately formed to provide clamping, bending, and combing functions. The planar structures, some of which are stacked one above another, are secured by removable threaded fasteners. Thus, such elements may be readily changed for different lead configurations and different forming requirements. Further, since two or more stations may be utilized, processing flexibility is available. Also, the foregoing disclosed radial lead cut and form apparatus requires only a small amount of space and allows for easy access to the insertion ready component, and thus is readily utilized with different robotic component insertion apparatus.

Although the foregoing has been a description and illustration of specific embodiments of the invention, various modifications and changes thereto can be made by persons skilled in the art without departing from the scope and spirit of the invention as defined by the following claims.

What is claimed is:

1. A component lead cutting and forming apparatus for radial lead electrical components secured to tape, comprising:
   means for sequentially positioning each of the electrical components at first and second stations;
   first clamping means located at said first station for strain relief clamping a selected component lead of an electrical component positioned at said first station to prevent stresses on the component;
   cutting and forming means cooperating with said first clamping means for cutting and forming said selected lead of the electrical component positioned at said first station;
   second clamping means located at said second station for strain relief clamping a selected component lead of an electrical component located at said second station to prevent stresses on the component; and
   cutting means cooperating with said second clamping means for cutting said selected lead of the electrical component positioned at said second station.

2. The component lead cutting and forming apparatus of claim 1 wherein said first clamping means comprises:
   body securing means for securing the body of the electrical component positioned at said first station; and
   lead securing means for securing said selected lead of the electrical component positioned at said first station.

3. The component lead cutting and forming apparatus of claim 2 wherein said cutting and forming means comprises:
   means for aligning said selected lead of the electrical component positioned at said first station;
   means for cutting said selected lead at a predetermined length; and
   forming means cooperating with said lead securing means for bending said selected lead into a predetermined shape.

4. The component lead cutting and forming apparatus of claim 3 wherein said lead securing means comprises:
   a stationary die; a moving clamp member which is selectively displaced toward said stationary die for clamping said selected lead of the electrical component positioned at said first station between said stationary die and said moving clamp, and means to move the clamp member.

5. The component lead cutting and forming apparatus of claim 4 wherein said aligning means comprises a moving comb and means to move the comb.

6. The component lead cutting and forming apparatus of claim 5 wherein said cutting means comprises a fixed blade, a moving blade, and means to move the blade.

7. The component lead cutting and forming apparatus of claim 6 wherein said forming means includes a movable die which is selectively displaced toward said stationary die for bending said lead and means to move the die.

8. The component lead cutting and forming apparatus of claim 7 wherein said moving comb and said moving die comprise a unitary structure including means to secure the structure to said moving blade to form a moving blade/comb-die structure.

9. The component lead cutting and forming apparatus of claim 8 wherein said moving blade/comb-die structure includes means to secure it to a moving carriage block, and wherein said moving clamp includes means to slidably secure it to said moving carriage block for motion relative to said blade/comb-die structure, and including means to move the carriage block.

10. The component lead cutting and forming apparatus of claim 1 wherein said second clamping means comprises:
   means for aligning said electrical lead; and
   means for securing said electrical lead after it is aligned.

11. The component lead cutting and forming apparatus of claim 10 wherein said aligning means comprises a moving comb including means to move the comb, and wherein said securing means comprises a moving clamp member, a stationary clamp member, and means to move the clamp member.

12. The component lead cutting and forming apparatus of claim 11 wherein said comb and said moving clamp member comprise individual members including means to secure them to each other to form a moving comb/clamp structure.

13. The component lead cutting and forming apparatus of claim 12 wherein said cutting means comprises a fixed blade and a movable blade including means to move the blade.

14. The component lead cutting and forming apparatus of claim 13 wherein said moving blade includes means to secure it to a movable support block having means to move the support block, and wherein said moving comb/clamp structure includes means to slidably secure it to said movable support block for motion relative to said moving blade.

15. The component lead forming apparatus of claim 1 wherein:
said first clamping means includes a first stationary clamp element having a bending surface, a first moving clamp element, and means to move the first clamp element;
said cutting and forming means includes a stationary cutting blade, and a moving assembly having means to move the assembly, a blade, a lead comb, and a bending die, said bending die cooperating with said bending die surface of said first stationary clamp element;
said second clamping means includes a second stationary clamping element having a cutting edge, a second moving clamp element, and means to move the second moving clamp element; and
said cutting means includes a moving blade for engaging said cutting edge of said second stationary clamping element and means for moving the blade.

16. The component lead forming apparatus of claim 15 wherein said first moving clamp element is slidably adjacent said moving assembly, and wherein said second moving clamp is slidably adjacent said moving blade.

17. The component lead forming apparatus of claim 16 wherein said moving means includes a moving carriage block, and wherein said moving assembly and said moving blade include means to secure them to said moving carriage.

18. The component lead forming apparatus of claim 17 further including biasing means for maintaining said first and second moving clamp elements respectively together with said moving assembly and said moving blade as said moving carriage is moved toward the stationary elements, and for allowing said moving assembly and said moving blade to continue movement after said first and second moving clamp elements engage leads against said first and second stationary clamping elements.

* * * * *